United States Patent [19]

Harrand

[11] Patent Number: 5,126,734
[45] Date of Patent: Jun. 30, 1992

[54] SWITCHING MATRIX CROSSPOINT

[75] Inventor: Michel Harrand, Seyssinet Pariset, France

[73] Assignee: SGS-Thomson Microelectronics S.A., Gentilly, France

[21] Appl. No.: 557,718

[22] Filed: Jul. 26, 1990

[30] Foreign Application Priority Data

Jul. 27, 1989 [FR] France .................. 89 10384

[51] Int. Cl.$^5$ .................. H04Q 1/18; H04M 3/00; G06G 7/12
[52] U.S. Cl. .................. 340/825.9; 340/825.89; 340/825.92; 379/292; 379/269; 307/495; 307/499
[58] Field of Search .................. 340/825.89, 825.90, 340/825.91, 825.93; 307/495, 499, 452; 379/292, 269

[56] References Cited

U.S. PATENT DOCUMENTS

| | | | |
|---|---|---|---|
| 3,963,872 | 6/1976 | Hagstrom et al. | 379/269 |
| 4,443,773 | 4/1984 | Rall et al. | 340/825.89 |
| 4,839,643 | 6/1989 | Koenig et al. | 340/825.89 |
| 4,866,432 | 9/1989 | Goething | 340/825.89 |
| 4,870,301 | 9/1989 | Petty | 307/495 |
| 4,949,086 | 8/1990 | Hofmann | 340/825.91 |

OTHER PUBLICATIONS

"A 250-MBIT/s CMOS Crosspoint Switch", (Shin and Hodges) pp. 479-486 vol. 24 No. 2, Apr. 1989.
Hayward et al. "CMOS VLSI Applications in Broadband Circuit Switching", *IEEE Journal on Selected Areas in Communications*, vol. SAC-5, No. 8 (Oct. 1987) pp. 1231-1241.
Scott et al., "A CMOS Slope Adaptive Delta Modulator", 1986 IEEE International Solid State Circuits Conference, Digest of Technical Papers (Feb. 1986) pp. 130, 131.

*Primary Examiner*—Donald J. Yusko
*Assistant Examiner*—Brian Zimmerman
*Attorney, Agent, or Firm*—Lowe, Price, LeBlanc & Becker

[57] ABSTRACT

A crosspoint for a switching matrix constituted by enhanced P-channel and N-channel MOS transistors. Each input line conductor (Ii1 and Ii2) is connected to an input of a first differential amplifier (M3, M4), each leg of which is associated by a current mirror circuit to a first current source (M9, M10, M11) enabled by a selection input (Sij) of the crosspoint. The outputs of the first differential amplifier are connected to a second differential amplifier (M1, M2) fed by a second current source (I) common to all the crosspoints of a same column. The outputs of the second differential amplifier are connected to the pair of conductors (Oj1, Oj2) of an output column, an extremity of this column being connected to the high voltage source (Vdd) through a resistor (R).

7 Claims, 2 Drawing Sheets

SWITCHING MATRIX CROSSPOINT

BACKGROUND OF THE INVENTION

The present invention relates to a switching matrix and more particularly to a broadband digital switching matrix liable to operate at very high frequencies, higher than 100 megabits per second, usable for example for switching digital TV channels.

A switching matrix is a circuit having n input channels and m output channels and permitting to independently apply on any of the m output channels any of the n input channels (or its complement). Each input channel can be connected to a chosen number of outputs. However, an output channel can only be connected to one input channel.

For realizing such a switching matrix, one tries to reach the following objectives:
- high operation frequency or low propagation time according to the application (asynchronous or synchronous system),
- low current consumption,
- low crosstalk ratio,
- small size of the circuit when integrated in a silicon wafer.

In the prior art, to obtain the above mentioned very high operation frequencies, a bipolar technology, for example of the ECL type, which permits reaching such frequencies, is first envisaged. However, with such a technology, the circuit surface is unavoidably important as well as its current consumption.

Thus, one has devised various means for realizing such circuits by using a CMOS technology, that is, a technology comprising N-channel and P-channel MOS transistors: indeed, one knows a priori that such a technology is liable to reduce current consumption and the surface of the circuit. However, the present crosspoint realizations using CMOS transistors exhibit, on the one hand, the drawback of a lack of rapidity, and, on the other hand, the drawback of being incompatible as regards their control voltage with the adjacent circuits for processing high frequency signals, which generally use ECL technology.

For controlling MOS transistors, it is generally necessary that the difference between thigh level and low level is several volts while control levels in ECL technology vary only a few hundred millivolts. Thus, to solve this compatibility problem, it has been necessary to provide circuits for converting the ECL control levels into CMOS control levels and CMOS control levels into ECL control levels. The ECL circuits exhibit the drawback, on the one hand, of requiring a large surface and therefore cancelling part of the advantages expected from CMOS technology and, on the other hand, of adding an important propagation time to the signals, which is particularly impairing when using signal transmission in the synchronous mode.

Moreover, using logic levels having a large difference for controlling MOS transistors causes switching times to be unavoidably long since it is necessary to charge the input capacitors of those MOS transistors and the charging time (dt) is directly proportional to the voltage difference (dV) between high and low levels (dT = CdV/i) for capacitive charges constituted by the gates of the MOS transistors.

An exemplar embodiment of an MOS transistor crosspoint is given in the article by Hyun J. Shin and David A. Hodges issued in IEEE Journal of Solid State Circuits, vol. 24, No. 2, Apr. 1988, entitled "A 250-Mbit/s CMOS Crosspoint Switch". In this article, a few problems associated with the use of MOS transistors are solved as regards the output dispersion of the control signals. By using a specific output amplifier represented in FIG. 7, page 482, of this article, the output voltage dispersion is limited and is compatible with ECL technology. However, the problem concerning the input control of ht MOS transistors is not solved and, as shown in FIG. 8 of this article, one uses for each matrix line an input buffer permitting conversion of ECL logic signals into CMOS logic signals.

An object of the invention is to provide for a switching matrix crosspoint permitting complete insertion of the above problems of ECL/CMOS compatibility and of operation rate.

BRIEF SUMMARY OF THE INVENTION

To achieve this object and others, the invention provides for a switching matrix crosspoint having n input lines (rows) and m output lines (columns), each line comprising a differential pair of conductors, this crosspoint being constituted by P-channel and N-channel enhanced MOS transistors. In this crosspoint:
- each input line conductor is connected to an input of a first differential amplifier, each leg of which is associated through a current mirror circuit to a first current source enabled by a selection input of the crosspoint,
- the outputs of the differential amplifier are connected to a second differential amplifier fed by a second current source common to all crosspoints of a same column, and
- the outputs of the differential pair are connected to the pair of conductors of an output column, an extremity of this column being connected to the high voltage source through a resistor.

According to an embodiment of the invention, means are provided for setting the voltage at the differential amplifier output when the memory point is not selected.

According to an embodiment of the invention, the differential amplifier comprises, in parallel, two legs constituted by a first P-channel transistor and a first N-channel transistor and by a second P-channel transistor and second N-channel transistor, respectively, the drains of the P-channel transistors being connected to a high supply source and the sources of the first and second N-channel transistors being connected to a low supply terminal through a third N-channel MOS transistor, said current source comprising between the high supply source and the low supply source a series circuit comprising a third P-channel transistor, the drain of which is connected to the gate, a fourth N-channel transistor, the gate of which receives the crosspoint selection signal, and a fifth N-channel transistor, the drain of which is connected to the gate; the current mirror circuit being formed by interconnecting the gates of the first, second and third P-channel transistors and by interconnecting the gates of the third and fifth N-channel transistors; the gates of the first and second N-channel transistors being respectively connected to each of the input channel conductors and the drains of those transistors being respectively connected to the control gates of the differential pair.

According to an embodiment of the invention ,the means for setting the voltage comprise a sixth N-channel transistor parallel connected to the third N-channel transistor and receiving the reverse selection signal.

According to an embodiment of the invention, each column comprises, in series with each resistor, a bipolar transistor, the collector of which is connected to the resistor, the emitter is connected to the column and the base is connected to the high supply source, the column being connected to a third current source.

BRIEF DISCLOSURE OF THE DRAWINGS

The foregoing and other objects, features and advantages of the invention will be apparent from the following detailed description of preferred embodiments as illustrated in the accompanying drawings wherein.

DETAILED DESCRIPTION OF THE INVENTION

Figure 1:
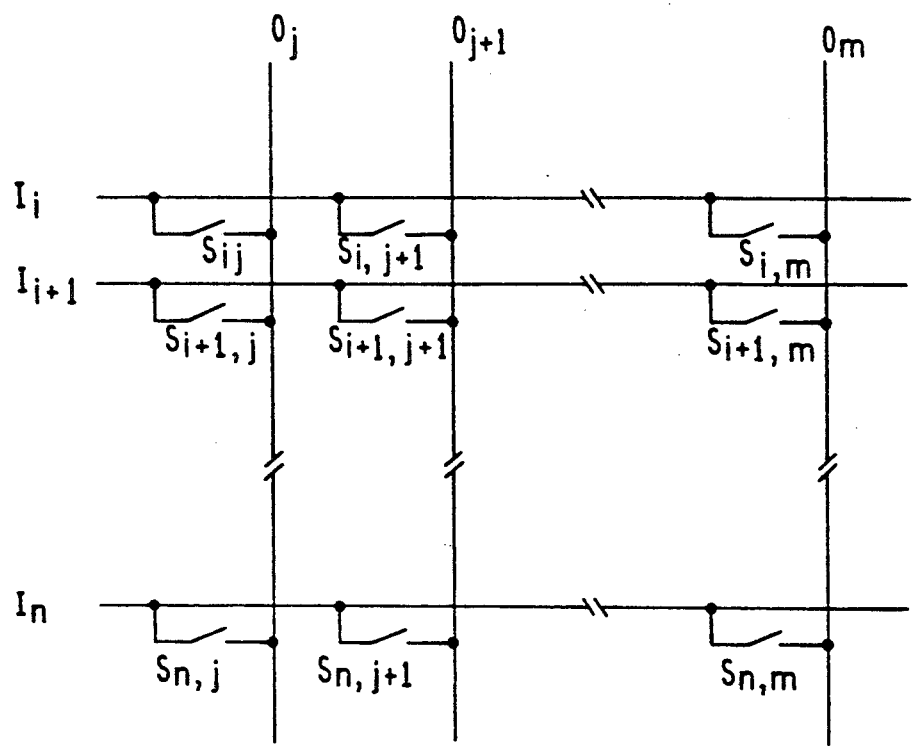
FIG. 1 is a general and schematic representation of a switching matrix.

As shown in FIG. 1, a switching matrix is designed to establish connections between input lines I1 ... Ii ... In and selected output line connections O1 ... Oj ... Om, the connections being determined by selection signals Sij controlling the switches arranged at the crosspoints of each line and each column (the selection signals are generally generated by a memory). Here, the specific case of a column to be connected to one row only (but where a given row can be connected to several columns) will be considered.

Figure 2:
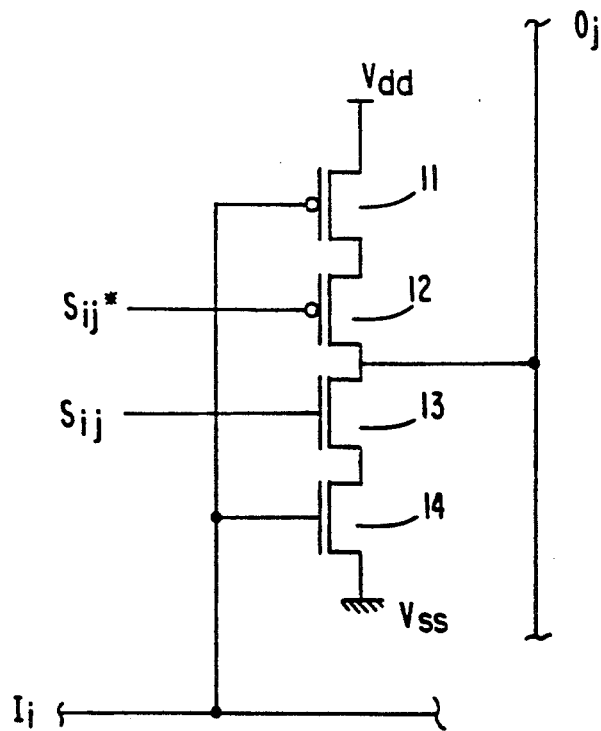
FIG. 2 shows the basic element of a CMOS crosspoint according to the prior art.

A conventional embodiment of a crosspoint realized according to CMOS technology is illustrated in FIG. 2 and corresponds for example to a portion of the crosspoint described in the above-mentioned article. In FIG. 2, are shown a portion of a row Ii and a portion of a column Oj. Between a high voltage source Vdd and a low voltage source Vss are connected in series four enhanced MOS transistors, namely: two P-channel MOS transistors 11 and 12 and two N-channel MOS transistors 13 and 14, successively. The gates of MOS transistors 11 and 14 are connected to row Ii. The gate of the N-channel MOS transistor 13 is connected to the selection signal Sij and the gate of the P-channel MOS transistor 12 is connected to the complement Sij* of selection signal Sij. Thus, if Sij is at a low level, transistors 12 and 13 are blocked and the connection point is inhibited. If Sij is set to 1, transistors 12 and 13 are conductive and the complement of signal Ii (Vdd if Ii is at a low level and Vss if Ii is at a high level) appears on line Oj.

The drawbacks of such a circuit are mentioned above. It will be noted that the improvement brought by the above document to this circuit consists in adding behind line Oj an amplification and amplitude limitation circuit for signals on this line.

Figure 3:
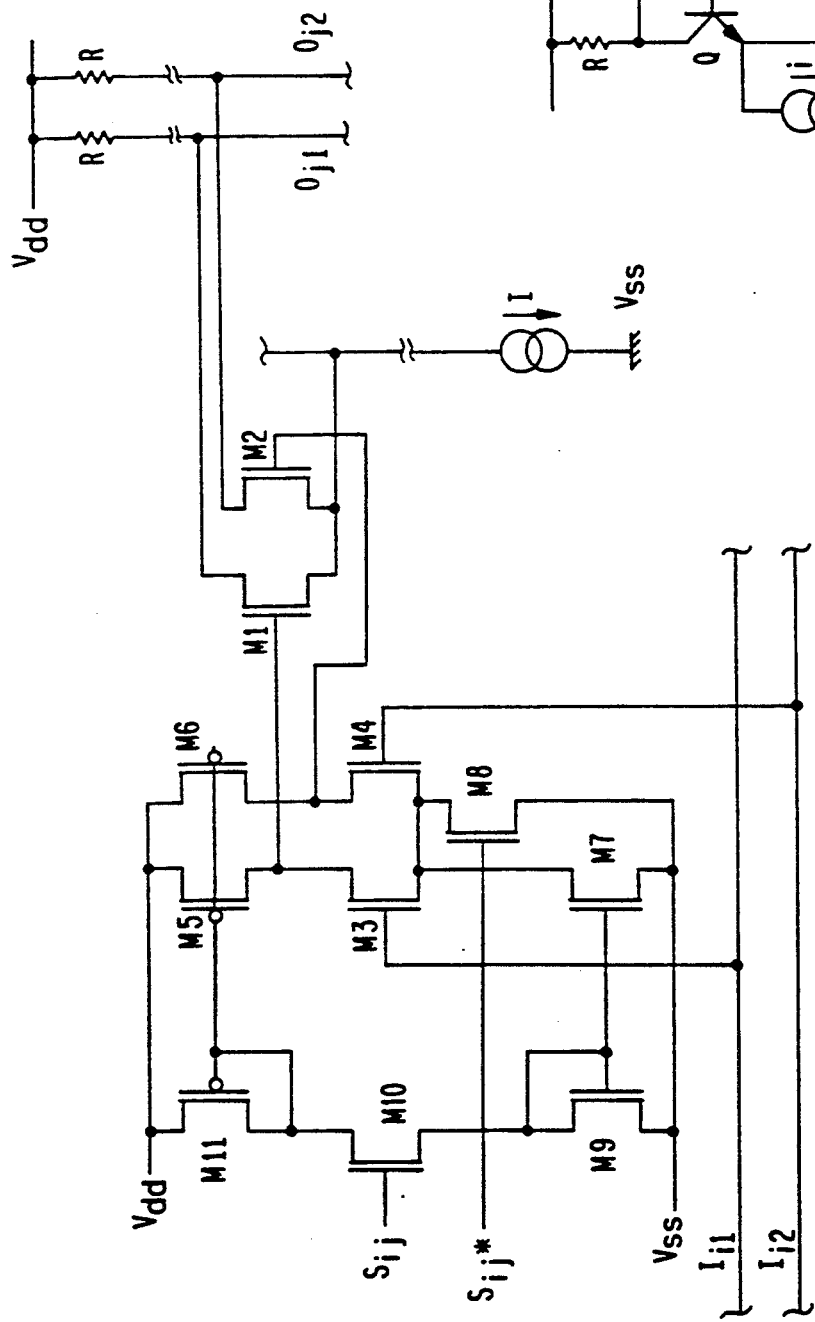
FIG. 3 shows a crosspoint according to the invention.

FIG. 3 schematically illustrates an embodiment of a circuit according to the invention. An input channel Ii is realized in the form of two differential conductors Ii1 and Ii2 and an output channel is constituted by a pair of differential conductors Oj1 and Oj2. The columns, that is, conductors Oj1 and Oj2, are connected to the high voltage source Vdd through resistors R. Thus, if a current I is extracted from one of conductors Oj1 and Oj2, the voltage on this conductor drops to a value Vdd−RI, while the other conductor is at a voltage Vdd. By properly choosing the values of R and I, it will then be possible to obtain on those lines ECL compatible levels.

The crosspoint comprises an output stage constituted by a differential amplifier, M1 and M2. The drains of those transistors are connected to each column Oj1 and Oj2 and the sources of those transistors are interconnected to an additional column connected to the low voltage supply Vss through a current source I. Thus, depending on whether transistor M1 or M2 is conductive, line Oj1 and Oj2 will be at a low logic level. It will be noted that the current source I is common to all crosspoints of a same column, as well as resistors R.

The gates of transistors M1 and M2 of the output amplifier are driven by a differential stage comprising N-channel MOS transistors, M3 and M4, the sources of which are interconnected and the gates are respectively connected to conductors Ii1 and Ii2 of the input channel Ii. The drains of transistors M3 and M4 are connected to the high voltage source Vdd through P-channel MOS transistors, M5 and M6, and the common source of transistors M3 and M4 is connected to the low supply source Vss through an N-channel MOS transistor, M7, arranged in parallel with an N-channel MOS transistor, M8, the gate of which receives the complement Sij* of the selection signal of this crosspoint.

The crosspoint also comprises, between the low supply source Vss and the high supply source Vdd, an N-channel MOS transistor, M9, an N-channel MOS transistor, M10, and a P-channel MOS transistor, M11. The gate of transistor M9 is connected to its drain and the gate of transistor M11 is connected to its drain. The gate of transistor M10 receives the selection signal Sij. Thus, when crosspoint ij is selected, that is, when signal Sij is at 1, the whole set of transistors M9, M10 and M11 constitutes a constant current source, practically independent of the dispersions of characteristics resulting from the N-channel and P-channel manufacturing process.

Transistors M5 and M6 have their gate connected to the gate of transistor M11 and transistor M7 has tis gate connected to the gate of transistor M9. Thus, transistors M5 and M6 form with transistor M11 a current mirror, and similarly transistor M7 with transistor M9.

This crosspoint operates as follows.

When signal Sij is at a high level, that is, when the crosspoint is selected, transistor M10 is conductive and transistor M8 is blocked. The transistor Ii1 or Ii2 with the highest level determines if transistor M3 or M4 is conductive, and therefore a current equal to that determined by the current source M9-M10-11 will flow through the leg M5-M3-M7 or through the leg M6-M4-M7, the other leg being blocked. As a result, transistor M1 or M2 of the output stage will be rendered conductive; therefore, column output conductor Oj1 or Oj2 will change its state. It will be noted that, except for selection signals, all the other signals cause the crosspoint to operate if they exhibit a level difference of about only a few hundred millivolts, which is compatible with the levels necessary for an ECL circuit to operate.

However, if signal Sij is at a low level for inhibiting ht crosspoint, there is no current flowing through supply source M9-M10-M11, transistors M5, M6 and M7 are blocked and transistor M8 becomes conductive, setting to low voltage (Vss) the sources of transistors M3 and M4 as well as their drains since those transistors remain substantially conductive. As a result, transistors M1 and M2 are blocked and no current is extracted from the output conductors Oj1 an Oj2 by the supply source I.

It will be noted that one of the advantages of the invention is that the load of the input signals is independent of the state (selected or not) of the switches. Therefore, changing the selection on the output channel does not impair the other channels, Hence, the signal propagation time is substantially constant and crosstalk phenomena associated with current fluctuations are avoided.

Of course, the invention si liable of numerous variants which will appear to those skilled in the art.

Figure 4:
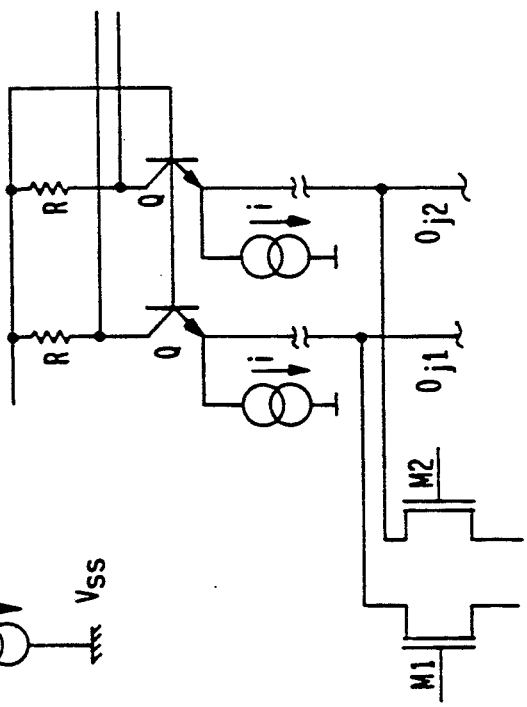
FIG. 4 illustrates a variant of an aspect of the invention.

FIG. 4 illustrates an exemplary variant wherein have been added on output columns Oj NPN-type bipolar transistors Q, the collector of which is connected to resistors R and the emitter is connected to the respective column Oj1, Oj2. Those emitters are also connected to current sources i. This permits to maintain at a constant voltage the drains of transistors M1 and M2. In that case, the column output is taken on the collectors of transistors Q. Owing to the fact the voltages are constant on the drains of transistors M1 and M2, and also on their sources, the capacitances on lines Oj1 and Oj2 have practically no effect on the circuit operation rate.

I claim:

1. A crosspoint for a switching matrix having n input lines (rows) and m output lines (columns), each line comprising a pair of conductors, said crosspoint comprising enhanced P-channel and N-channel MOS transistors, wherein:

each input line conductor (Ii1 and Ii2) is connected to an input of a first differential amplifier (M3, M4), each leg of which is associated by a current mirror circuit to a first current source (M9, M10, M11) enabled by a selection input (Sij) of said crosspoint.

the outputs of the first differential amplifier are connected to a second differential amplifier (M1, M2) fed by a second current source (I) common to all the crosspoints of a selected output line, and the outputs of the second differential amplifier are connected to said selected output line, an extremity of which is connected to a high voltage source (Vdd) through a resistor (R).

2. A crosspoint according to claim 1, further comprising means (M8, Sij) for setting the voltage at the output of said first differential amplifier when said crosspoint is not selected.

3. A crosspoint according to claim 2, wherein said means for setting the voltage comprises a fourth N-channel transistor (M8) connected in parallel to the third N-channel transistor (M7) for receiving the reverse selection signal (Sij*).

4. A crosspoint according to claim 1, wherein each of said columns comprises, in series with a resistor (R), a bipolar transistor (Q), the collector of which is connected to said resistor, the emitter of which is connected to one of said pair of conductors of said column, and the base of which is connected to a high voltage supply source.

5. A crosspoint according to claim 1, wherein said first differential amplifier comprises, in parallel, two legs respectively comprising a first P-channel transistor (M5) and a first N-channel transistor (M3), and a second P-channel transistor (M6) and a second N-channel transistor (M4), the drains of said P-channel transistors being connected to said high voltage source and the sources of said N-channel transistors being connected to a low voltage supply terminal (Vss) through a third N-channel transistor (M7).

6. A crosspoint according to claim 5, herein said means for setting the voltage comprises a fifth N-channel transistor (M8) connected in parallel to said third N-channel transistor and receiving the reverse selection signal (Sij*).

7. A crosspoint according to claim 5, wherein said first current source comprises a third P-channel transistor (M11), the drain of which is connected to the gate thereof, a sixth N-channel transistor (M10), the gate of which receives a selection signal (Sij) of said crosspoint, and a seventh N-channel transistor (M9), the drain of which is connected to the gate thereof, said current mirror circuit being implemented by the gate interconnection of said first, second and third N-channel transistors, the gates of said first and second N-channel transistors being connected respectively to each input conductor and the gates of said first and second N-channel transistors being connected respectively to the control gates of said second differential amplifier.

* * * * *